(12) United States Patent
Yang et al.

(10) Patent No.: US 7,915,111 B2
(45) Date of Patent: Mar. 29, 2011

(54) SEMICONDUCTOR DEVICE WITH HIGH-K/DUAL METAL GATE

(75) Inventors: Wen-Chih Yang, Hsinchu (TW); Chien-Liang Chen, Hsinchu (TW); Chii-Horng Lee, Hsinchu (TW); Harry Chuang, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 731 days.

(21) Appl. No.: 11/836,015

(22) Filed: Aug. 8, 2007

(65) Prior Publication Data

US 2009/0039433 A1   Feb. 12, 2009

(51) Int. Cl.
*H01L 21/8238* (2006.01)
(52) U.S. Cl. ........................ 438/199; 438/233
(58) Field of Classification Search .................. 438/199, 438/233
See application file for complete search history.

(56) References Cited

U.S. PATENT DOCUMENTS

| | | | |
|---|---|---|---|
| 6,303,418 B1 * | 10/2001 | Cha et al. | 438/199 |
| 7,160,767 B2 | 1/2007 | Brask et al. | |
| 2001/0027005 A1 * | 10/2001 | Moriwaki et al. | 438/592 |
| 2006/0278934 A1 * | 12/2006 | Nagahama | 257/369 |

* cited by examiner

*Primary Examiner* — Zandra Smith
*Assistant Examiner* — Jamie Niesz
(74) *Attorney, Agent, or Firm* — Haynes and Boone, LLP

(57) ABSTRACT

An apparatus, and method of manufacture thereof, comprising a first semiconductor device and a second semiconductor device. The first semiconductor device includes a first gate electrode having a first metal layer forming a first trench and a second metal layer filling the first trench, wherein the first and second metal layers have substantially different metallic compositions. The second semiconductor device includes a second gate electrode having a third metal layer forming a second trench and a fourth metal layer filling the second trench, wherein the third and fourth metal layers have substantially different metallic compositions, and wherein the first and third metal layers have substantially different metallic compositions.

14 Claims, 6 Drawing Sheets

SEMICONDUCTOR DEVICE WITH HIGH-K/DUAL METAL GATE

BACKGROUND

When making a CMOS device that includes metal gate electrodes, it may be necessary to make the NMOS and PMOS gate electrodes from different materials. A replacement gate process may be used to form gate electrodes from different metals. In that process, a polysilicon layer, bracketed by a pair of spacers, is removed to create a trench between the spacers on both NMOS and PMOS gate areas simultaneously. The trench is filled with a first metal. Then, the first metal layer is removed from either the NMOS or PMOS gate area and replaced with a second metal that differs from the first metal.

The replacement gate process requires the polysilicon and metal layers to be formed on a dielectric layer. The dielectric layer serves as an etch stop layer and prevents significant numbers of ions from reaching the channel when ions are implanted into the polysilicon layers. The dielectric layer may, for example, comprise silicon dioxide or a high-k dielectric layer.

U.S. Pat. No. 7,160,767 to Brask, et al. ("Brask"), provides a method for making a semiconductor device that includes metal gate electrodes, wherein such method includes replacing polysilicon layers with metal layers without damaging the channel region. However, Brask also has disadvantages. For example, the Brask method includes a large number of steps and is otherwise complex, such as its required removal of two different dummy gates, its deposition of two different high-K dielectric layers, and its performance of two different CMP processes. The Brask method is also disadvantageous in that gate height is lost due to the requirement for two different CMP processes. The complex and lengthy method taught by Brask is also very expensive. Brask also requires thick layers of precious metals, which are expensive to obtain. Moreover, the Brask method results in a metal gate plagued by internal seams, gaps or voids which, when not sufficiently filled, results in excessively high gate resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
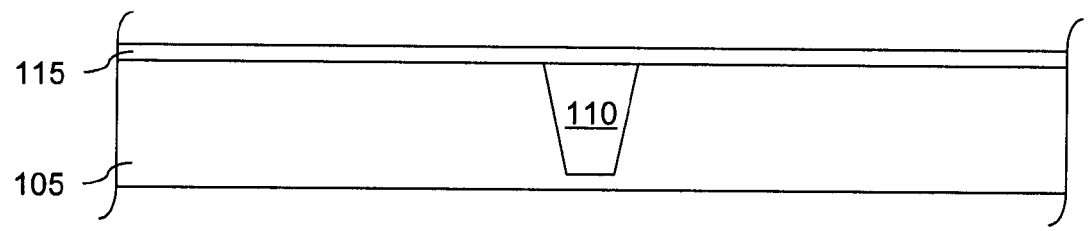
FIG. 1 is a sectional view of at least a portion of an apparatus in an intermediate stage of manufacture according to one or more aspects of the present application.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of at least a portion of an apparatus 100 in an intermediate stage of manufacture according to one or more aspects of the present disclosure. The apparatus 100 includes a substrate 105 having a shallow trench isolation (STI) feature 110 formed therein. The substrate 105 may be or comprise a silicon or other semiconductor substrate, and may be a silicon-on-insulator (SOI) or other semiconductor-on-insulator substrate. The STI 110 may be formed by etching or otherwise forming a recess in the substrate 105 and subsequently filling the recess with silicon dioxide and/or another dielectric material, possibly followed by a chemical-mechanical-polishing (CMP) or other planarizing step. However, means for separating transistor active regions other than the STI 110 are also within the scope of the present disclosure.

The apparatus 100 also includes an oxide layer 115 formed over the substrate 105 and the STI 110. The oxide layer 115 may be grown over the substrate 105, such as by thermal oxidation resulting from exposing the substrate 105 to an oxidizing ambient at an elevated temperature. Thus, for example, in embodiments in which the substrate 105 substantially comprises silicon, the oxide layer 115 may substantially comprise silicon dioxide, carbon doped silicon dioxide, silicon oxynitride, silicon nitride, nitrided silicon dioxide, and/or other materials. The oxide layer 115 may be subjected to a nitridation process and/or an annealing process, such as to affect the effective oxide thickness, threshold voltage, gate leakage, and/or other operating characteristics. The oxide layer 115 may have a thickness ranging between about 5 angstroms and about 30 angstroms, although other thicknesses are also within the scope of the present disclosure.

Figure 2:
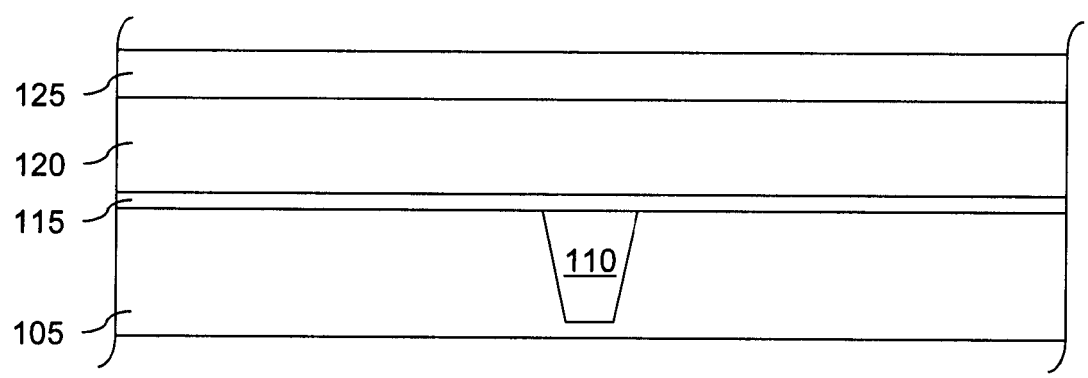
FIG. 2 is a sectional view the apparatus shown in FIG. 1 in a subsequent stage of manufacture according to one or more aspects of the present application.

Referring to FIG. 2, illustrated is a sectional view of the apparatus 100 shown in FIG. 1 in a subsequent stage of manufacture after a polysilicon layer 120 has been formed on the oxide layer 115, and the subsequent formation of a hardmask layer 125 on the polysilicon layer 120. The polysilicon layer may be formed by one or more chemical vapor deposition (CVD) processes, variants thereof, and/or other deposition processes, and may have a thickness ranging between about 100 angstroms and about 2000 angstroms. The hardmask layer 125 may comprise silicon nitride and/or other mask materials, and may be formed by one or more CVD and/or other processes, possibly to a thickness ranging between about 100 angstroms and about 1500 angstroms.

Figure 3:
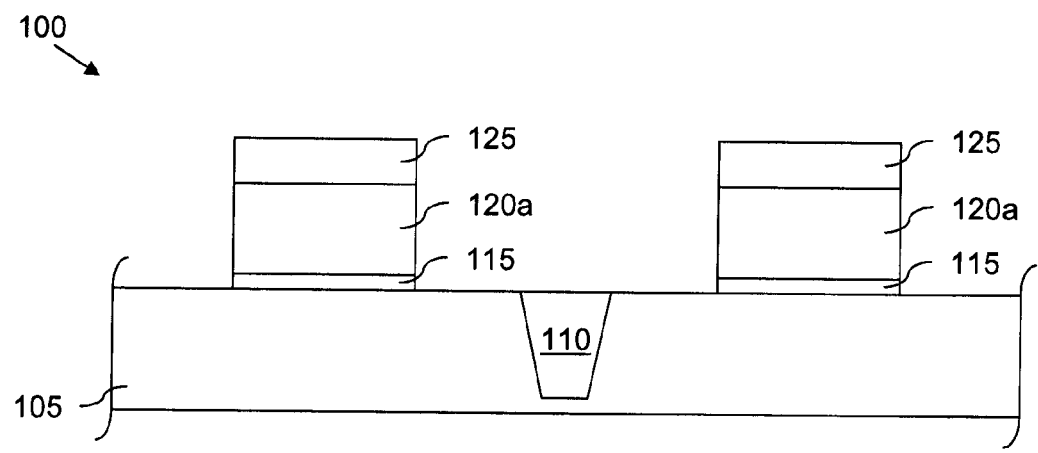
FIG. 3 is a sectional view the apparatus shown in FIG. 2 in a subsequent stage of manufacture according to one or more aspects of the present application.

Referring to FIG. 3, illustrated is a sectional view of the apparatus 100 shown in FIG. 2 in a subsequent stage of manufacture after the hardmask layer 125 has been patterned and employed to pattern the polysilicon layer 120 to form dummy gates 120a. The hardmask layer 125 and the polysilicon layer 120 may be patterned by two or more etching processes, including one or more first etching processes employed to pattern the hardmask layer 125 and one or more subsequent etching processes employing the patterned hardmask layer 125 to pattern the polysilicon layer 120. These etching processes may include dry etching, wet etching, reactive-ion-etching (RIE) and/or other material removal processes. The etching processes may also remove portions of the gate oxide layer 115 which are not protected by the patterned hardmask layer 125, thereby exposing portions of the substrate 105 between the dummy gates 120a.

Figure 4:
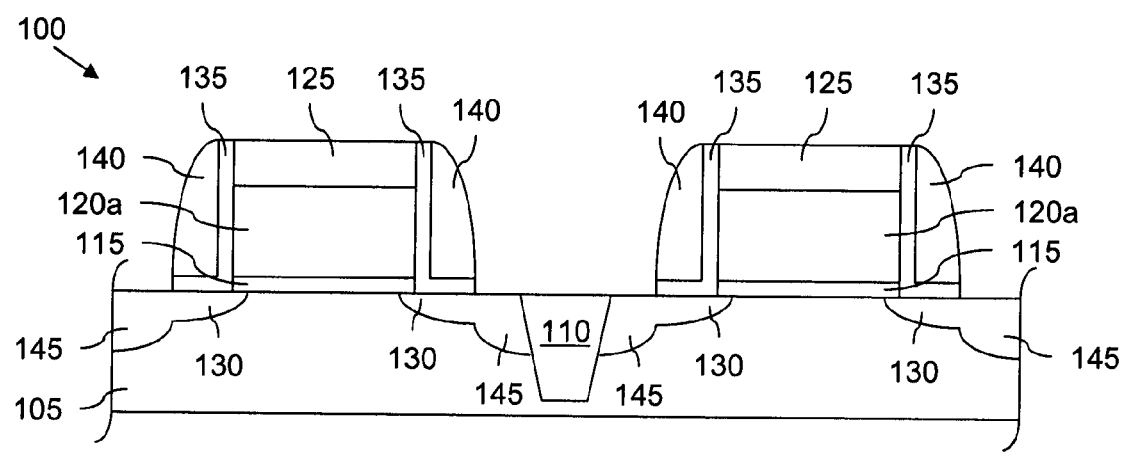
FIG. 4 is a sectional view the apparatus shown in FIG. 3 in a subsequent stage of manufacture according to one or more aspects of the present application.

Referring to FIG. 4, illustrated is a sectional view of the apparatus 100 shown in FIG. 3 in a subsequent stage of manufacture after lightly doped source/drain regions 130 are formed in the substrate 105 on opposing sides of the dummy gates 120a, and oxide liners 135 are subsequently formed spanning the sidewalls of the dummy gates 120a and the remaining portions of the oxide layer 115 and hardmask layer 125. FIG. 4 also depicts spacers 140 that are formed on the liners 135 on opposing sides of the dummy gates 120a, as well as heavily doped source/drain regions 145 that are formed in the substrate 105 on opposing sides of the dummy gates 120a outside the spacers 140.

The source/drain regions 130, 145 may be formed by implanting ions into the substrate, followed by an appropriate annealing process. The oxide liners 135 and spacers 140 may be conventionally deposited or otherwise formed. The spacers 140 may comprise one or more layers of silicon nitride and/or other materials.

Figure 5:
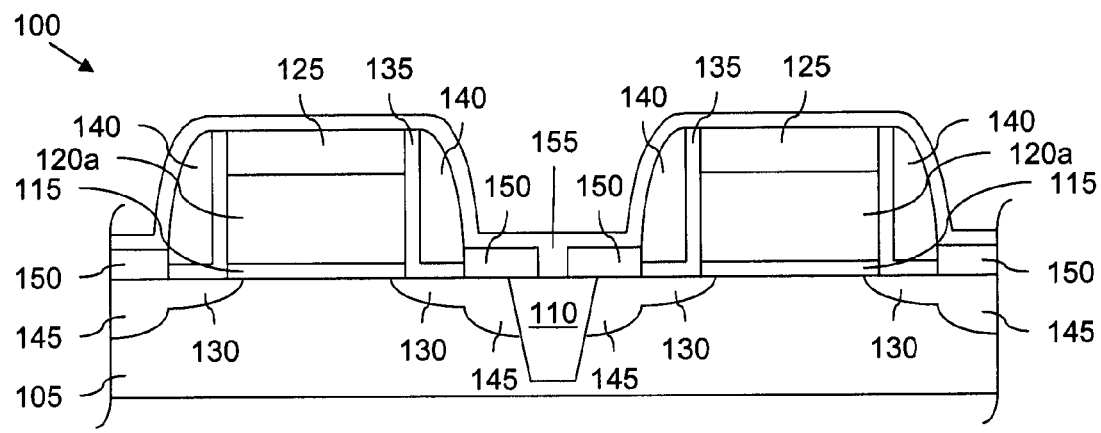
FIG. 5 is a sectional view the apparatus shown in FIG. 4 in a subsequent stage of manufacture according to one or more aspects of the present application.

Referring to FIG. 5, illustrated is a sectional view of the apparatus 100 shown in FIG. 4 in a subsequent stage of manufacture after silicide contacts 150 are formed on the heavily doped source/drain regions 145, and an etch stop layer 155 is subsequently formed over the silicide contacts 150, the spacers 140 and the hardmask layers 125. The etch stop layer 155 may be conventionally deposited or otherwise formed, possibly to a thickness ranging between about 100 angstroms and 1500 angstroms. The etch stop layer may comprise silicon dioxide, hafnium dioxide, silicon carbide, carbon-doped silicon oxide, carbon-doped silicon nitride, and/or other materials.

Figure 6:
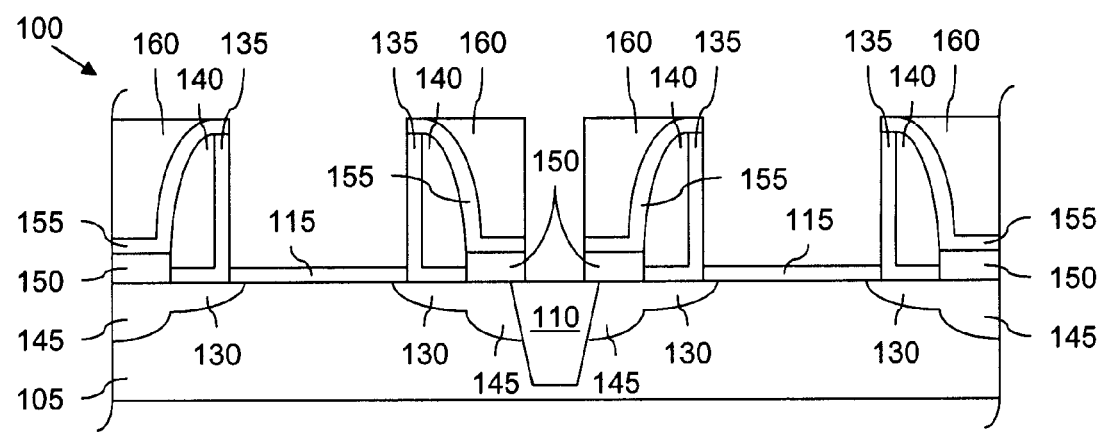
FIG. 6 is a sectional view the apparatus shown in FIG. 5 in a subsequent stage of manufacture according to one or more aspects of the present application.

Referring to FIG. 6, illustrated is a sectional view of the apparatus 100 shown in FIG. 5 in a subsequent stage of manufacture after an interlevel dielectric layer 160 is formed over the etch stop layer 155 and subsequently planarized using the etch stop layer 155 as a stopping point. Thereafter, the dummy gates 120a, hardmask layer portions 125, and portions of the etch stop layer 155 between the spacers 140 and liners 135 are removed, thereby forming openings corresponding to where the dummy gates 120a had been formed. Thus, the remaining portions of the oxide layer 115 between the spacers 140 and spacer liners 135, as well as the STI 110, may become exposed through the openings. The openings may have a width of about 24 nm, although other widths are also within the scope of the present disclosure. The interlevel dielectric layer 160 may be conventionally deposited or otherwise formed, and may comprise silicon dioxide, a low-k material and/or other materials. The interlevel dielectric layer 160 may also be doped with phosphorus, boron, and/or other elements.

In an exemplary embodiment, the oxide layer 115 thus exposed in the openings may be specifically configured with two purposes in mind. First, the oxide layer 115 is configured to serve as an etch stop layer while etching is performed to remove the dummy gates 120a. Consequently, the etching process utilized to remove the dummy gates 120a, and possibly other subsequent processing, is less likely to damage the underlying channel region of the substrate 105. Second, the oxide layer 115 is configured to subsequently serve as an ultra-thin oxide layer providing an interfacial layer of high-k dielectric to maintain a good interface between the underlying channel region of the substrate 105 and the gate electrode that is subsequently formed thereon.

Figure 7:
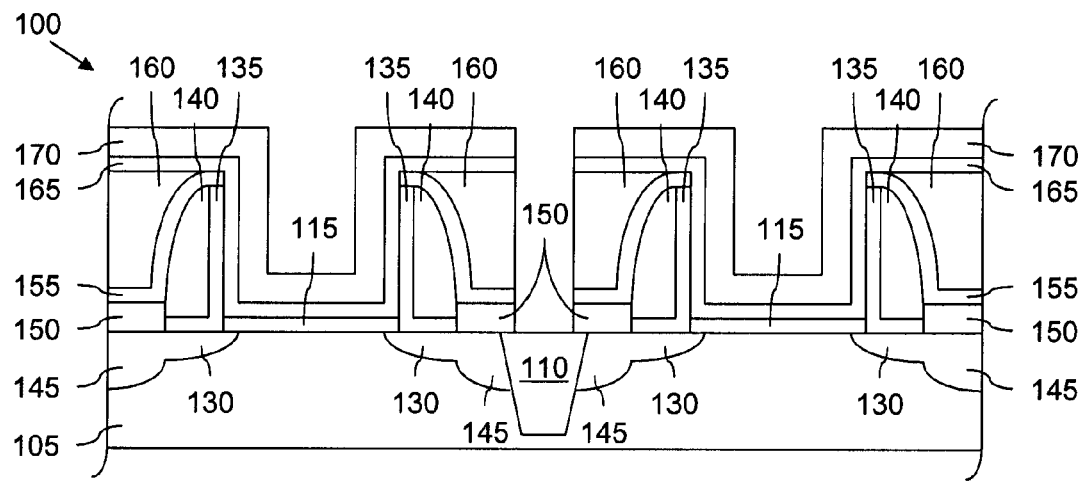
FIG. 7 is a sectional view the apparatus shown in FIG. 6 in a subsequent stage of manufacture according to one or more aspects of the present application.

Referring to FIG. 7, illustrated is a sectional view of the apparatus 100 shown in FIG. 6 in a subsequent stage of manufacture after a high-k dielectric layer 165 is formed over the interlevel dielectric layer 160 and remaining portions of the oxide layer 115, including spanning the sides of the spacer liners 135. A metal layer 170 is then formed over the high-k dielectric layer 165, having a profile confirming to the high-k dielectric layer 165.

The high-k dielectric layer 165 may be conventionally deposited or otherwise formed, and may comprise hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or other materials. The metal layer 170 may be conventionally deposited or otherwise formed, and may substantially comprise hafnium, zirconium, titanium, tantalum, aluminum, a metal carbide, ruthenium, palladium, platinum, cobalt, nickel, a conductive metal oxide, and/or other materials. The metal layer 170 may have a thickness ranging between about 10 angstroms and about 500 angstroms, although other thicknesses are also within the scope of the present disclosure.

Figure 8:
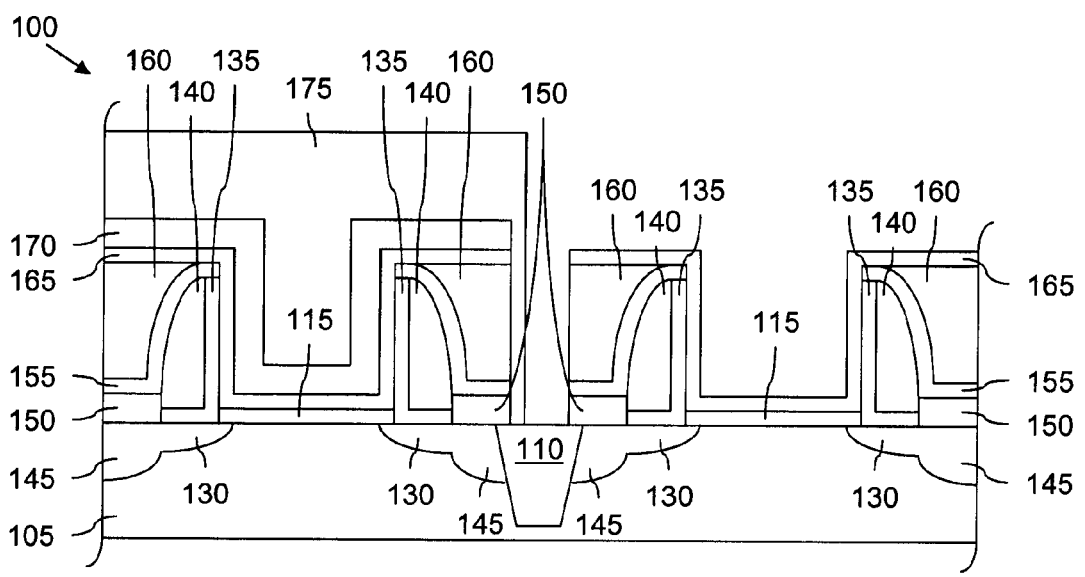
FIG. 8 is a sectional view the apparatus shown in FIG. 7 in a subsequent stage of manufacture according to one or more aspects of the present application.

Referring to FIG. 8, illustrated is a sectional view of the apparatus 100 shown in FIG. 7 in a subsequent stage of manufacture after a photoresist layer 175 is formed over the metal layer 170, although the photoresist layer 175 is formed over only one of the devices being fabricated. The metal layer 170 is subsequently removed from over the other device being fabricated. The metal layer 170 may be removed via one or more wet etching, dry etching, RIE and/or other removal processes.

Figure 9:
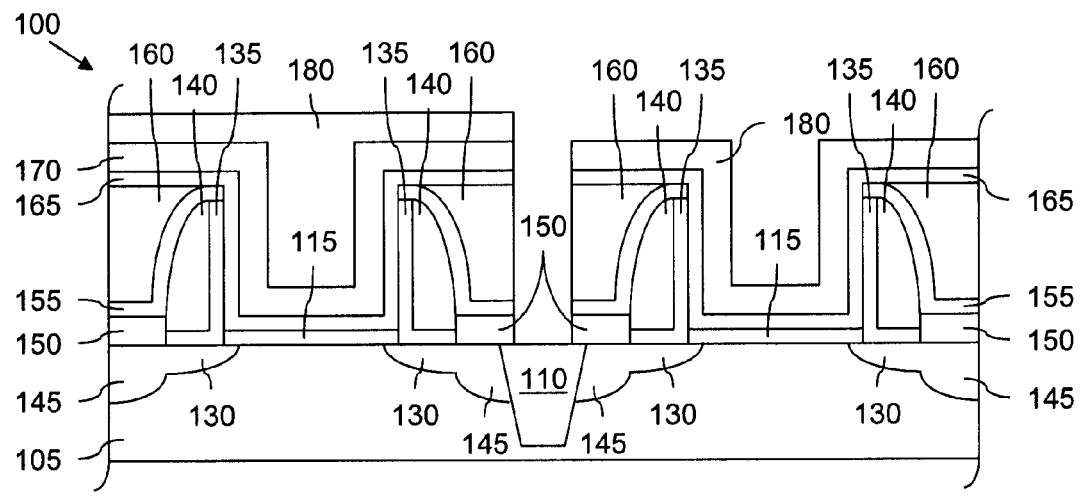
FIG. 9 is a sectional view the apparatus shown in FIG. 8 in a subsequent stage of manufacture according to one or more aspects of the present application.

Referring to FIG. 9, illustrated is a sectional view of the apparatus 100 shown in FIG. 8 in a subsequent stage of manufacture after the photoresist layer 175 is removed and a second metal layer 180 is formed over both devices being fabricated. The second metal layer 180 is formed over the portion of the first metal layer 170 that remains over one of the devices being formed, including filling the trench formed by the first metal layer 170 between the spacers 140. The second metal layer 180 is also formed over the other device being formed, including in the trench formed by the high-k dielectric layer 165 and having a profile conforming to the high-k dielectric layer 165. The second metal layer 180 may be conventionally deposited or otherwise formed, and may substantially comprise hafnium, zirconium, titanium, tantalum, aluminum, a metal carbide, ruthenium, palladium, platinum, cobalt, nickel, a conductive metal oxide, and/or other materials, possibly to a thickness ranging between about 10 angstroms and about 1500 angstroms. In an exemplary embodiment, the first and second metal layers 170, 180 have different compositions. For example, the first metal layer 170 may substantially comprise hafnium, whereas the second metal layer 180 may substantially comprise titanium. However, other material combinations are also within the scope of the present disclosure.

Figure 10:
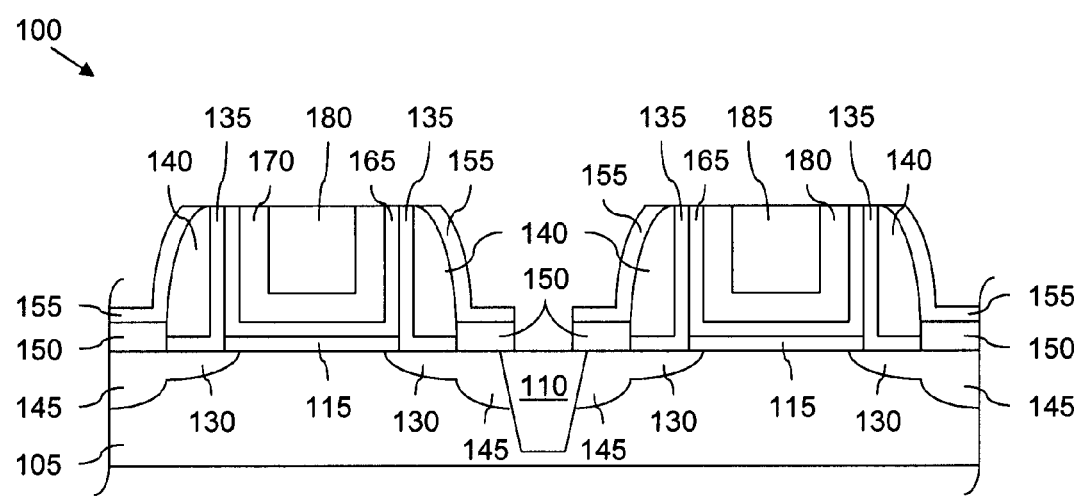
FIG. 10 is a sectional view the apparatus shown in FIG. 9 in a subsequent stage of manufacture according to one or more aspects of the present application.

Referring to FIG. 10, illustrated is a sectional view of the apparatus 100 shown in FIG. 9 in a subsequent stage of manufacture after a third metal layer 185 is formed over both devices being fabricated, including filling the trench formed by the second metal layer 180. The first, second and third metal layers 170, 180, 185 are then planarized, stopping at the interlevel dielectric layer 160. The remaining portions of the interlevel dielectric layer 160 are then removed, leaving the configuration shown in FIG. 10. The third metal layer 185 may substantially comprise tungsten, although other materials are also within the scope of the present disclosure. The third metal layer 185 may have a thickness ranging between about 500 angstroms and about 5000 angstroms, after planarization.

In conventional approaches, such gate-last/gate-filled approaches often resulted in a gate electrode having a seam or void in a central region of the electrode. Such a seam or void can cause high gate resistance. However, methods of manufacturing a gate electrode according to one or more of the above-described aspects of the present disclosure may eliminate such gap formation. For example, the first metal layer of each gate electrode described above may be substantially thinner than the second metal layer (e.g., the filler layer), such that the trench defined by the first metal layer has a smaller aspect ratio (ratio of height to width), which may discourage the gap or void formation of the prior art approaches.

In addition, each gate electrode may have two different metal compositions according to aspects of the present disclosure. The lower, thinner metal layer may enable maintaining the desired work function of the metal/silicon interface, whereas the upper, thicker metal layer may simultaneously provide a reduced gate resistance, possibly due to the elimination of voids or seams therein. Moreover, because the metal combinations of the gate electrodes of adjacent devices can be varied, the work function of both NMOS and PMOS devices can be tailored to specific applications.

In an exemplary embodiment, the lower metal layer (e.g., metal layers 170 and 180) may be formed by CVD or atomic layer deposition (ALD). These processes traditionally have lower throughput compared to other deposition processes, particularly with regard to certain metals. However, according to aspects of the present disclosure, the bulk of at least a portion of the gate electrodes may be formed by CVD of tungsten, which can have higher throughput and lower cost. CVD of tungsten can also be utilized when filling the trench formed by the first, underlying gate electrode metal layer to more easily fill higher aspect ratio trenches which, as described above, may reduce the problems associated with void or seam formation inside the gate electrode.

Figure 11:
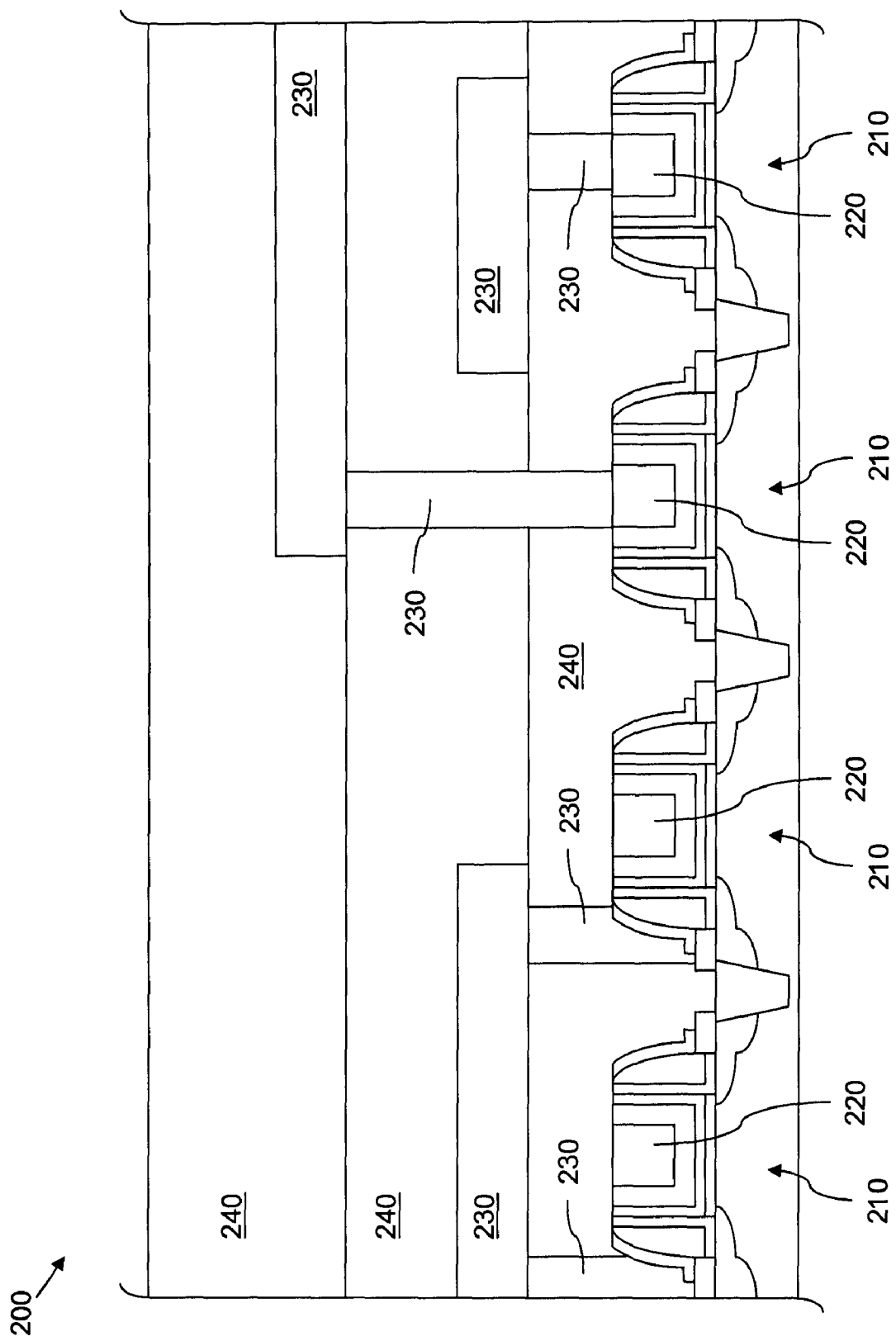
FIG. 11 is a sectional view of at least a portion of an apparatus according to one or more aspects of the present application.

Referring to FIG. 11, illustrated is a sectional view of at least a portion of an apparatus 200 constructed according to one or more aspects of the present disclosure. The apparatus 200 may be or comprise a semiconductor device, and represents one exemplary implementation of the aspects described above with regard to FIGS. 1-10 or otherwise within the scope of the present disclosure.

The apparatus 200 includes a plurality of CMOS or other devices 210 formed at least partially in a common substrate. Each of the devices 210 includes a gate electrode 220 substantially similar or identical to one of the gate electrodes shown in FIG. 10 or otherwise in accord with one or more aspects of the present disclosure.

The apparatus 200 also includes a plurality of horizontal and vertical interconnects 230 contacting ones of the gate electrodes 220 and/or contacts of the devices 210 and thereby interconnecting the devices 210 with one another and/or other components of the apparatus 200. The interconnects 230 are electrically isolated from one another, where desired, by one or more of a plurality of insulating layers 240.

It should be evident to those skilled in the art that, in view of the above and the figures, the present disclosure introduces an apparatus comprising: (1) a first semiconductor device including: (a) first source/drain regions located in a substrate; and (b) a first gate electrode located over the substrate and laterally between the first source/drain regions and including a first metal layer forming a first trench and a second metal layer filling the first trench, wherein the first and second metal layers have substantially different metallic compositions; and (2) a second semiconductor device including: (a) second source/drain regions located in the substrate; and (b) a second gate electrode located over the substrate and laterally between the second source/drain regions and including a third metal layer forming a second trench and a fourth metal layer filling the second trench, wherein the third and fourth metal layers have substantially different metallic compositions and the first and third metal layers have substantially different metallic compositions. The first metal layer may substantially comprise a first metallic composition, the second metal layer may substantially comprise a second metallic composition, the third metal layer may substantially comprise the second metallic composition, the fourth metal layer may substantially comprise a third metallic composition, and the first, second and third metallic compositions may each be substantially different. The first metal layer may substantially comprise a first material selected from the group consisting of hafnium, zirconium, titanium, aluminum and a metal carbide, the second metal layer may substantially comprise a second material selected from the group, the third metal layer may substantially comprise the second material, and the fourth metal layer may substantially comprise tungsten. The first metal layer may substantially comprise a first material selected from the group consisting of ruthenium, palladium, platinum, cobalt and nickel, the second metal layer may substantially comprise a second material selected from the group, the third metal layer may substantially comprise the second material, and the fourth metal layer may substantially comprise tungsten. The first semiconductor device may be one of a first plurality of substantially similar semiconductor devices, the second semiconductor device may be one of a second plurality of substantially similar semiconductor devices, and the apparatus may further comprise a plurality of interconnects collectively interconnecting ones of the first and second pluralities of semiconductor devices.

The present disclosure also provides a method of manufacturing first and second semiconductor devices comprising, at least in one embodiment: (1) forming a first semiconductor device by: (a) forming first spacers over a substrate; and (b) forming a first gate electrode located over the substrate and laterally between the first spacers by: (i) forming a first metal layer between the first spacers and defining a first trench; and (ii) forming a second metal layer filling the first trench, wherein the first and second metal layers have substantially different metallic compositions; and (2) forming a second semiconductor device by: (a) forming second spacers over the substrate; and (b) forming a second gate electrode located over the substrate and laterally between the second spacers by: (i) forming a third metal layer between the second spacers and defining a second trench; and (ii) forming a fourth metal layer filling the second trench, wherein the third and fourth metal layers have substantially different metallic compositions and the first and third metal layers have substantially different metallic compositions. The first metal layer may substantially comprise a first metallic composition, the second metal layer may substantially comprise a second metallic composition, the third metal layer may substantially comprise the second metallic composition, the fourth metal layer may substantially comprise a third metallic composition, and the first, second and third metallic compositions may each be substantially different. The first metal layer may substantially comprise a first material selected from the group consisting of hafnium, zirconium, titanium, aluminum and a metal carbide, the second metal layer may substantially comprise a second material selected from the group, the third metal layer may substantially comprise the second material, and the fourth metal layer may substantially comprise tungsten. The first metal layer may substantially comprise a first material selected from the group consisting of ruthenium, palladium, platinum, cobalt and nickel, the second metal layer may substantially comprise a second material selected from the group, the third metal layer may substantially comprise the second material, and the fourth metal layer may substantially comprise tungsten. The first and second spacers may be formed substantially simultaneously. The second and third metal layers may have substantially the same composition and may be formed substantially simultaneously.

The present disclosure also introduces a method of manufacturing a semiconductor apparatus comprising, at least in one embodiment, forming a first dummy gate stack and a second dummy gate stack over a substrate, forming spacers on the substrate and spanning opposing sides of the first and second dummy gate stacks, and removing at least portions of the first and second dummy gate stacks, thereby forming a first opening corresponding to the first dummy gate stack and a second opening corresponding to the second dummy gate stack. A first metal layer is deposited in the first and second openings, a portion of the first metal layer is removed from the second opening, and a second metal layer is deposited in the first and second openings. A third metal layer is deposited on the second metal layer in the second opening, and the first, second and third metal layers are planarized to form a first gate electrode comprising portions of the first and second metal layers and a second gate electrode comprising portions of the second and third metal layers. The method may further comprise forming a shallow trench isolation (STI) feature in a substrate prior to forming the first and second dummy gate stacks. Forming the first and second dummy gate stacks may comprise forming a thermal oxide layer over the substrate, forming a polysilicon layer over the thermal oxide layer, forming a hardmask over the polysilicon layer, and etching through the hardmask, the polysilicon layer and the thermal oxide layer to form the first and second dummy gate stacks each comprising a remaining portion of each of the hardmask, the polysilicon layer and the thermal oxide. The method may further comprise implanting lightly doped source/drain regions into the substrate on opposing sides of each of the first and second dummy gate stacks prior to forming the spacers, and implanting heavily doped source/drain regions into the substrate after forming the spacers. The method may further comprise forming silicide contacts on each of the heavily doped source/drain regions. The method may further comprise depositing a common etch stop layer (CESL) over the silicide contacts, the spacers, and the first and second dummy gate stacks, depositing an interlayer dielectric (ILD) layer over the CESL, and planarizing the ILD layer until a portion of the CESL is exposed. Removing at least portion of the first and second dummy gate stacks may at least partially comprise etching away the exposed portion of the CESL and the first and second dummy gate stacks, thereby forming the first and second openings. The method may further comprise depositing a high-k dielectric layer on the remaining portion of the ILD layer and in the first and second openings including on the remaining portion of the thermal oxide layer within the first and second openings and spanning the interior walls of the first and second openings. Depositing the first metal layer in the first and second openings may include depositing the first metal layer on the high-k dielectric layer in the first and second openings, and depositing the second metal layer in the first and second openings may include depositing the second metal layer on the high-k dielectric layer in the second opening. Removing a portion of the first metal layer from the second opening may include forming a photoresist hardmask over the first metal layer over the first opening but not over the second opening, removing a portion of the first metal layer over the second opening using the photoresist hardmask, and removing the photoresist hardmask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing first and second semiconductor devices, comprising:
    forming a first semiconductor device by:
        forming first spacers over a substrate; and
        forming a first gate electrode located over the substrate and laterally between the first spacers by:
            forming a first metal layer between the first spacers and defining a first trench; and
            forming a second metal layer completely filling the first trench, wherein the first and second metal layers have substantially different metallic compositions; and
    forming a second semiconductor device by:
        forming second spacers over the substrate; and
        forming a second gate electrode located over the substrate and laterally between the second spacers by:
            forming a third metal layer between the second spacers and defining a second trench; and
            forming a fourth metal layer completely filling the second trench, wherein the third and fourth metal layers have substantially different metallic compositions and the first and third metal layers have substantially different metallic compositions;
    wherein the second and third metal layers have substantially the same composition and are formed substantially simultaneously.

2. The method of claim 1 wherein:
the first metal layer substantially comprises a first metallic composition;
the second metal layer substantially comprises a second metallic composition;
the third metal layer substantially comprises the second metallic composition;
the fourth metal layer substantially comprises a third metallic composition; and
the first, second and third metallic compositions are each substantially different.

3. The method of claim 1 wherein:
the first metal layer substantially comprises a first material selected from the group consisting of hafnium, zirconium, titanium, aluminum and a metal carbide;
the second metal layer substantially comprises a second material selected from the group;
the third metal layer substantially comprises the second material; and
the fourth metal layer substantially comprises tungsten.

4. The method of claim 1 wherein:
the first metal layer substantially comprises a first material selected from the group consisting of ruthenium, palladium, platinum, cobalt and nickel;
the second metal layer substantially comprises a second material selected from the group;
the third metal layer substantially comprises the second material; and
the fourth metal layer substantially comprises tungsten.

5. The method of claim 1 wherein the first and second spacers are formed substantially simultaneously.

6. A method of manufacturing a semiconductor apparatus, comprising:
forming a first dummy gate stack and a second dummy gate stack over a substrate;
forming spacers on the substrate and spanning opposing sides of the first and second dummy gate stacks;
removing at least portions of the first and second dummy gate stacks, thereby forming a first opening corresponding to the first dummy gate stack and a second opening corresponding to the second dummy gate stack;
depositing a first metal layer in the first and second openings;
removing a portion of the first metal layer from the second opening;
depositing a second metal layer in the first and second openings;
depositing a third metal layer on the second metal layer in the second opening; and
planarizing the first, second and third metal layers to form a first gate electrode comprising portions of the first and second metal layers and devoid of any portion of the third metal layer and a second gate electrode comprising portions of the second and third metal layers.

7. The method of claim 6 further comprising forming a shallow trench isolation (STI) feature in a substrate prior to forming the first and Second dummy gate stacks.

8. The method of claim 7 wherein forming the first and second dummy gate stacks comprises:
forming a thermal oxide layer over the substrate;
forming a polysilicon layer over the thermal oxide layer;
forming a hardmask over the polysilicon layer; and
etching through the hardmask, the polysilicon layer and the thermal oxide layer to form the first and second dummy gate stacks each comprising a remaining portion of each of the hardmask, the polysilicon layer and the thermal oxide.

9. The method of claim 8 further comprising:
implanting lightly doped source/drain regions into the substrate on opposing sides of each of the first and second dummy gate stacks prior to forming the spacers; and
implanting heavily doped source/drain regions into the substrate after forming the spacers.

10. The method of claim 9 further comprising forming silicide contacts on each of the heavily doped source/drain regions.

11. The method of claim 10 further comprising:
depositing a common etch stop layer (CESL) over the suicide contacts, the spacers, and the first and second dummy gate stacks;
depositing an interlayer dielectric (ILD) layer over the CESL; and
planarizing the ILD layer until a portion of the CESL is exposed.

12. The method of claim 11 wherein removing at least portion of the first and second dummy gate stacks at least partially comprises etching away the exposed portion of the CESL and the first and second dummy gate stacks, thereby forming the first and second openings.

13. The method of claim 12 further comprising depositing a high-k dielectric layer on the remaining portion of the ILD layer and in the first and second openings including on the remaining portion of the thermal oxide layer within the first and second openings and spanning the interior walls of the first and second openings, wherein depositing the first metal layer in the first and second openings includes depositing the first metal layer on the high-k dielectric layer in the first and second openings, and wherein depositing the second metal layer in the first and second openings includes depositing the second metal layer on the high-k dielectric layer in the second opening.

14. The method of claim 13 wherein removing a portion of the first metal layer from the second opening includes:
forming a photoresist hardmask over the first metal layer over the first opening but not over the second opening;
removing a portion of the first metal layer over the second opening using the photoresist hardmask; and
removing the photoresist hardmask.

* * * * *